United States Patent [19]
Furukawa et al.

[11] Patent Number: 5,932,048
[45] Date of Patent: Aug. 3, 1999

[54] METHOD OF FABRICATING DIRECT-BONDED SEMICONDUCTOR WAFERS

[75] Inventors: Hiroshi Furukawa; Hirotaka Kato, both of Hiratsuka; Hiroaki Yamamoto, Miyazaki-gun; Kazuaki Fujimoto, Hiratsuka, all of Japan

[73] Assignee: Komatsu Electronic Metals Co., Ltd., Hiratsuka, Japan

[21] Appl. No.: 08/882,348

[22] Filed: Jun. 25, 1997

Related U.S. Application Data

[63] Continuation-in-part of application No. 08/623,951, Mar. 29, 1996, abandoned.

[30] Foreign Application Priority Data

Apr. 6, 1995 [JP] Japan ................................ 7-104649

[51] Int. Cl.$^6$ ........................ H01L 21/324; H01L 21/304
[52] U.S. Cl. .................... 156/153; 156/281; 148/DIG. 3; 148/DIG. 12; 148/DIG. 135; 148/DIG. 159; 438/455; 438/906; 438/959; 438/964; 438/967; 438/974; 438/977
[58] Field of Search ................................ 156/153, 281; 148/DIG. 12, DIG. 135, DIG. 159, DIG. 3; 438/977, 974, 967, 964, 959, 906, 455

[56] References Cited

U.S. PATENT DOCUMENTS

| | | |
|---|---|---|
| 4,671,846 | 6/1987 | Shimbo et al. . |
| 4,771,046 | 9/1988 | Bajor et al. . |
| 4,939,101 | 7/1990 | Black et al. . |
| 5,169,472 | 12/1992 | Goebel . |
| 5,236,118 | 8/1993 | Bower et al. . |
| 5,266,824 | 11/1993 | Abe et al. . |
| 5,514,235 | 5/1996 | Mitani et al. . |

OTHER PUBLICATIONS

Haisma, J., et al, Silicon–on–Insulator Wafer Bonding–Wafer Thinning Technological Evaluations, Japanese Journal of Applied Physics, vol. 2, No. 8, pp. 1426–1443, Aug. 1989.

Wiget, R. et al. "Silicon to silicon direct bonding—characterization of the interface and manufacture of p–i–n diodes," Fifth European Conference on Power Electronics and Applications, Brighton, U.K., Sep. 13–16, 1993, pp. 63–68, vol. 2 of 8 (abstract only).

Wiget, R. et al. "Silicon direct bonding (SDB)—substrate to material for electronic devices," Proceedings of 1995 International Conference on Power Electronics and Drive Systems, Singapore, Feb. 21–24, 1995, pp. 75–81 vol. 1 of 2 (abstract only).

Qinyi, T., et al., *Acta Electronica Sinica*, (Mar. 1991), vol. 19, No. 2, pp. 27–33 (abstract only).

*Primary Examiner*—Jeff H. Aftergut
*Attorney, Agent, or Firm*—Varndell Legal Group

[57] ABSTRACT

A method of direct-bonding semiconductor wafers limits the time interval between a bonding step and a bonding anneal step or performs a baking step between the bonding and bonding anneal steps at a predetermined temperature for a predetermined time interval to prevent the formulation of voids on the edge regions of the wafers. The method for fabricating laminated semiconductor wafers includes a bonding step to fit together two polished semiconductor wafers by bonding jigs, and a succeeding bonding anneal step to laminate the wafers. In the method the bonding anneal step is preferably carried out within an hour following the bonding step; or a baking step at a predetermined temperature for a predetermined time interval is carried out between the bonding step and the bonding anneal step. Further, the method can prevent heavy metal impurities attached to the surface of the wafer from diffusing into the wafer by baking the wafer for over 5 minutes at above 100° C. in the period between the bonding step and the annealing step.

3 Claims, 6 Drawing Sheets

METHOD OF FABRICATING DIRECT-BONDED SEMICONDUCTOR WAFERS

CROSS-REFERENCE TO RELATED APPLICATION

This application is a continuation-in-part application of U.S. Ser. No. 08/623,951, filed Mar. 29, 1996 now abandoned.

BACKGROUND OF THE INVENTION

1. Field of the Invention

The present invention relates to a manufacturing method for direct-bonded semiconductor wafers, and more specifically, to a method of direct-bonding semiconductor wafers each other.

2. Technical Backgrounds

A conventional manufacturing method for direct-bonded semiconductor wafers, such as Bonded SOI (SILICON ON INSULATOR) wafer, includes a bonding step (B) and a bonding anneal step (C). The bonding step (B) is provided for bonding a substrate wafer 1 to another wafer 2 by bonding jigs. The two wafers are cleaned prior to the bonding step (B). The substrate wafer 1 has one side of a single mirror face. One side of wafer 2 is a single mirror face and has been processed by hot oxidation to form a SiO film of a predetermined thickness. The bonding anneal step (C) is carried out at a predetermined time interval after the bonding step (B). The predetermined time is decided by the operators who judge the situation of the furnace for heating the wafers.

In the above conventional manufacturing method, the time from terminating the bonding step (B) to beginning the bonding anneal step (C) is not the same for different process flows. Moreover, voids 10, i.e., regions where the wafers do not fit together or connect together, will be formed on edge regions of the wafers, as shown in FIG. 8. Direct-bonded wafers with even one void on the edge regions have to be discarded as defective products. In addition, the number of voids increases as the time delay (S) between the bonding step (B) and the bonding anneal step (C) increases.

Moreover, in the prior-art method, an annealing process under a high temperature of over 1000° C. is performed after the bonding step. Therefore, heavy metal impurities originating from the bonding jig while performing bonding, such as Fe, Cr and Ni, become attached to the wafer, and then diffuse into the wafer while annealing. This results in an increase of the current leakage at the pn junction and a shortening of the carrier's lifetime, so that the electrical characteristics of the semiconductor device deteriorate.

In order to increase the yield of the direct-bonded wafers, these problems have to be overcome.

SUMMARY OF THE INVENTION

Accordingly, the present invention provides a manufacturing method for direct-bonded wafers which prevents the formation of voids on wafer edge regions. The present invention has been developed in part by investigating the formation of voids. The method of the present invention is based on the discovery that no void exists at the moment when the bonding step is finished and that the number of voids increases as the time passes by.

The present invention identifies the time interval between the bonding step and the bonding anneal step of the manufacturing method and sets forth a limit for this time interval in order to eliminate the voids. The present invention also provides a baking step, which is carried out at a predetermined temperature for a predetermined time interval, between the bonding step and the bonding anneal step to prevent the formation of voids.

Another object of this invention is to provide a fabrication method for a mounted semiconductor wafer, which can reduce the contamination of the wafer by heavy metals while performing annealing. This includes a fabrication method for a mounted semiconductor wafer comprises: a step of bonding two mirror-polished semiconductor wafers by using a bonding jig; and a subsequent step of annealing to mount the semiconductor wafers together, wherein the semiconductor wafers being mounted together are baked for 5 minutes at over 100° C., and then are cleaned by using an acidic solution.

The manufacturing method of direct-bonded wafers according to a first embodiment of the present invention includes a bonding step to fit together two polished semiconductor wafers by bonding jigs, and a succeeding bonding anneal step to create tightly bonded interface between the wafers. This method is characterized in that the bonding anneal step is carried out within an hour after the bonding step.

The manufacturing method of direct-bonded wafers according to a second embodiment of the present invention includes a bonding step to fit together two polished semiconductor wafers by bonding jigs, and a succeeding bonding anneal step to laminate the wafers. This method is characterized in that a baking step at a temperature of about 80° C. for at least 30 minutes or about 100° C. for at least 5 minutes is carried out between the bonding step and the bonding anneal step. It is also found that baking the bonded wafer at a predetermined temperature in a predetermined time from the bonding step to the annealing step can inhibit the generation of voids on the circumference of the wafer.

The aforementioned methods can prevent the formation of voids on edge regions of the wafers by carrying out the bonding anneal step such as within an hour following the bonding step or baking step as soon as possible after the bonding step. The existing voids cannot be removed by the bonding anneal step, and the number of voids will not further increase after the bonding anneal step.

Furthermore, during the period of the bonding step and the annealing step, baking the wafer for over 5 minutes at over 100° C. can prevent the formation of voids, and cleaning with acidic solution, washing with water and drying the wafer can provide a desired bonding strength. The bonding strength represents the strength that is necessary to separate the base wafer and the active wafer after they are bonded together, such as when it is necessary to separate and bond the wafers again. By the cleaning with an acidic solution after baking, heavy metal impurities attached to the surfaces of the wafers can be removed, therefore the amount of heavy metal impurities that diffuse into the wafers while annealing can be reduced.

BRIEF DESCRIPTION OF THE DRAWINGS

Other objects, features, and advantages of the present invention will become apparent from the following detailed description of the preferred but non-limiting embodiment.

The description is made with reference to the accompanying drawings in which.

DETAILED DESCRIPTION OF THE INVENTION

The manufacturing methods of the present invention are practiced and are described as follows. The voids on the edge regions of the wafers are examined and measured by a supersonic Scanning Acoustic Microscope (SAM).

Embodiment 1

Figure 1:
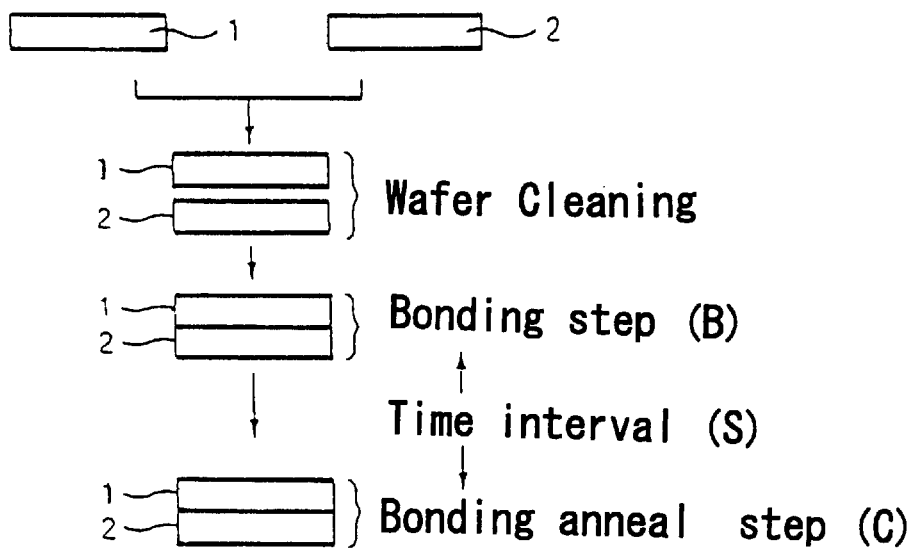
FIG. 1 illustrates the process flow of the wafer bonding method according to a first preferred embodiment of the present invention.
Figure 2:
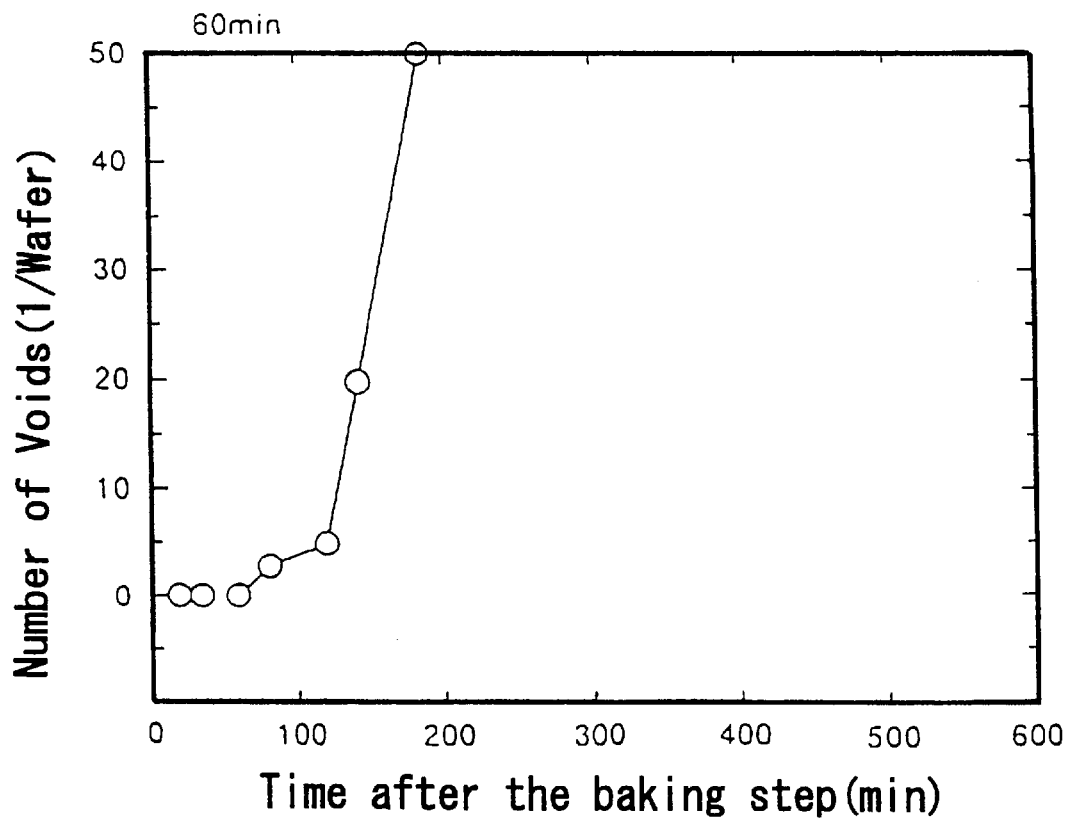
FIG. 2 illustrates the relationship between the number of voids and the time after the bonding step.

Referring to FIG. 1, two polished semiconductor wafers 1 and 2 (wafer is a base wafer and wafer 2 is an active wafer), are cleaned. Then a bonding step (B) is carried out, that is, the two wafers are fitted together by bonding jigs. The formation of voids is identified at different time intervals between the bonding step and the bonding anneal step (C). For example, five time intervals including 20, 30, 60, 90 and 120 minutes between the bonding step and the bonding anneal step (C) are chosen to examine the formation of voids. The results are shown in FIG. 2, and as is apparent from FIG. 2, obviously no void exists in the case where the time interval between the bonding step and the bonding anneal step is within 60 minutes. Also as shown in FIG. 2 the number of voids increases as the length of the time interval between the bonding step and the bonding anneal step increases.

In the present embodiment, since the bonding anneal step (C) is carried out within an hour following the bonding step, i.e., the time interval (S) is not longer than 60 minutes, no void exists on the edge regions of the direct-bonded wafers. Therefore, the present method is characterized in that the bonding anneal step is carried out within an hour after the bonding step is finished.

Embodiment 2

First, two polished semiconductor wafers 1 and 2 are cleaned, similar to those of the previous embodiment, and are fitted together by the bonding jigs. See, for example, FIG. 7. Then a baking step (M) of the present invention is carried out. In order to verify the effect of the baking step, four levels of baking conditions are taken into consideration. Each case of all the four levels includes five samples in which the formation of voids is examined during and after the baking step. The results of level 1 through level 4 are illustrated in FIG. 3 through FIG. 6, respectively. In these figures, the axis of abscissas represents the time after the bonding step, and the axis of ordinates represents the number of voids.

(1) Level 1

Figure 3:
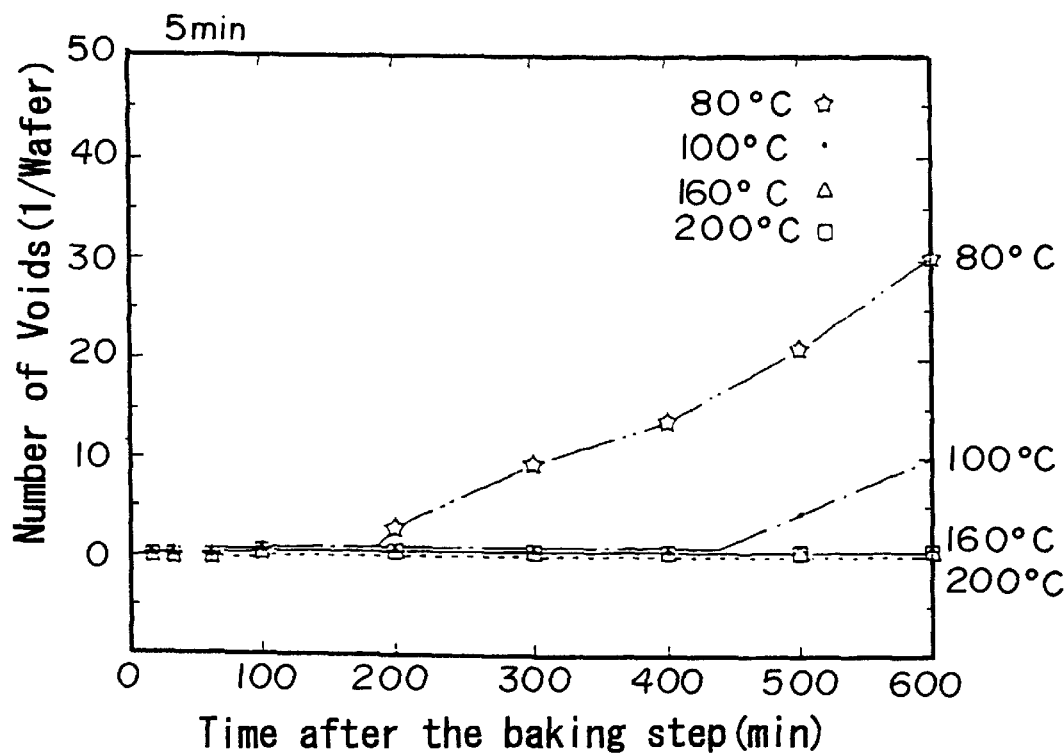
FIG. 3 illustrates the relationship between the number of voids and the time after a level 1 baking process.

The baking step is carried out at temperatures of 80° C., 100° C., 160° C. and 200° C., respectively, for 5 minutes. The number of voids are examined and are shown in FIG. 3. When the baking temperature is 80° C., as shown by a star sign "☆" in the figure, voids appear after about 200 minutes after the bonding step. For a baking temperature of 100° C. (denoted by a dot sign "●"), voids appear after about 400 minutes. As to 160° C. (denoted by a triangular sign "Δ") and 200° C. (denoted by a rectangular sign "□"), no void is observed even 600 minutes after the bonding step.

(2) Level 2

Figure 4:
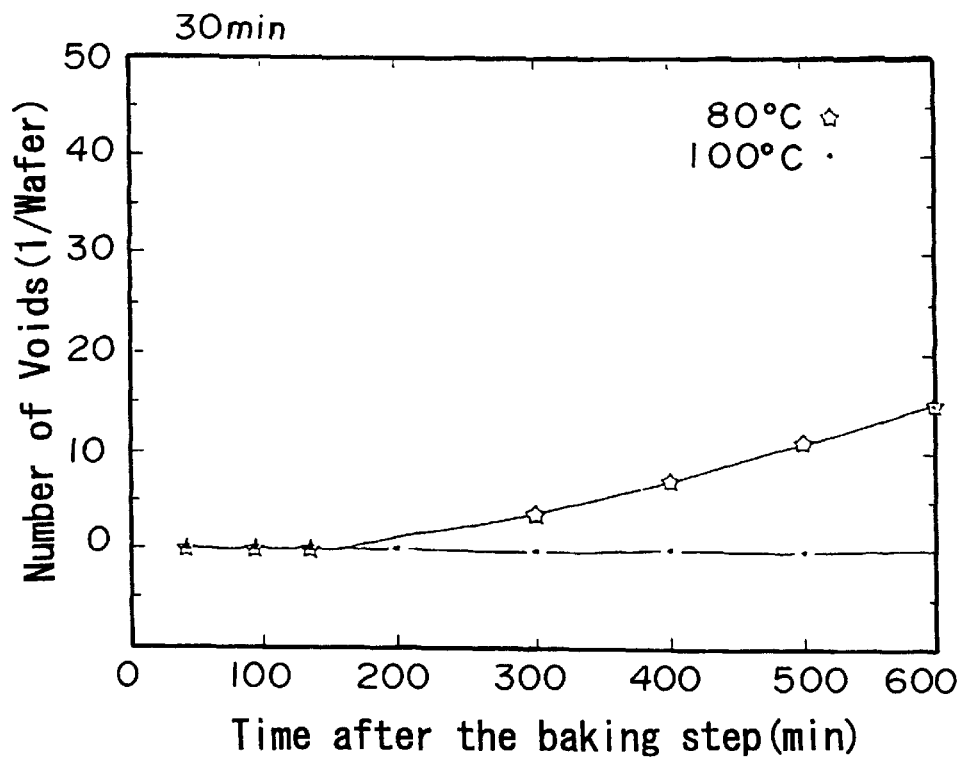
FIG. 4 illustrates the relationship between the number of voids and the time after a level 2 baking process.

The baking step is carried out at temperatures of 80° C. and 100° C. for 30 minutes. The numbers of voids are shown in FIG. 4. When the baking temperature is 80° C. (denoted by the star sign "☆" in the figure), voids appear about 140 minutes after the bonding step. As to 160° C., (denoted by the dot sign "●"), no void is observed even 600 minutes after the bonding step.

(3) Level 3

Figure 5:
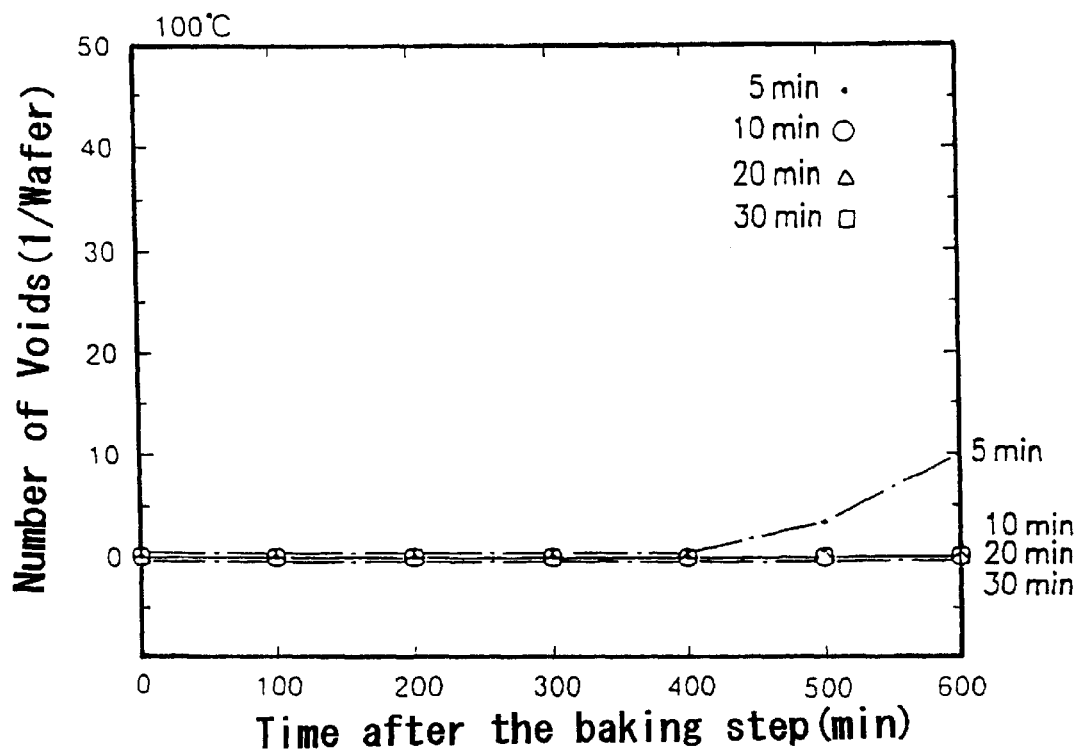
FIG. 5 illustrates the relationship between the number of voids and the time after a level 3 baking process.

The baking step is carried out at a temperature of 100° C. for 5, 10, 20 and 30 minutes, respectively. The numbers of voids are ascertained and are illustrated in FIG. 5. After baking for 5 minutes (denoted by the dot sign "●"), voids appear only about 500 minutes after the bonding step. In cases where baking is for 10 minutes (denoted by the sign "○"), for 20 minutes (denoted by the triangular sign "Δ") and for 30 minutes (denoted by rectangular the sign "Δ"), no void is observed even 600 minutes after the bonding step.

(4) Level 4

Figure 6:
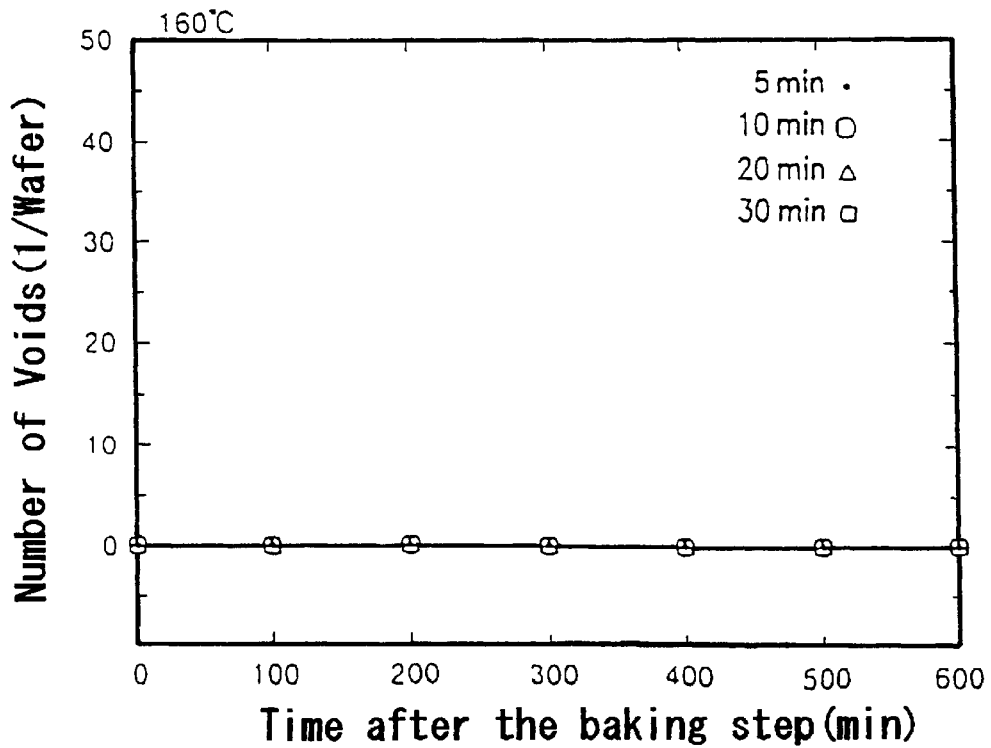
FIG. 6 illustrates the relationship between the number of voids and the time after a level 4 baking process.
Figure 7:
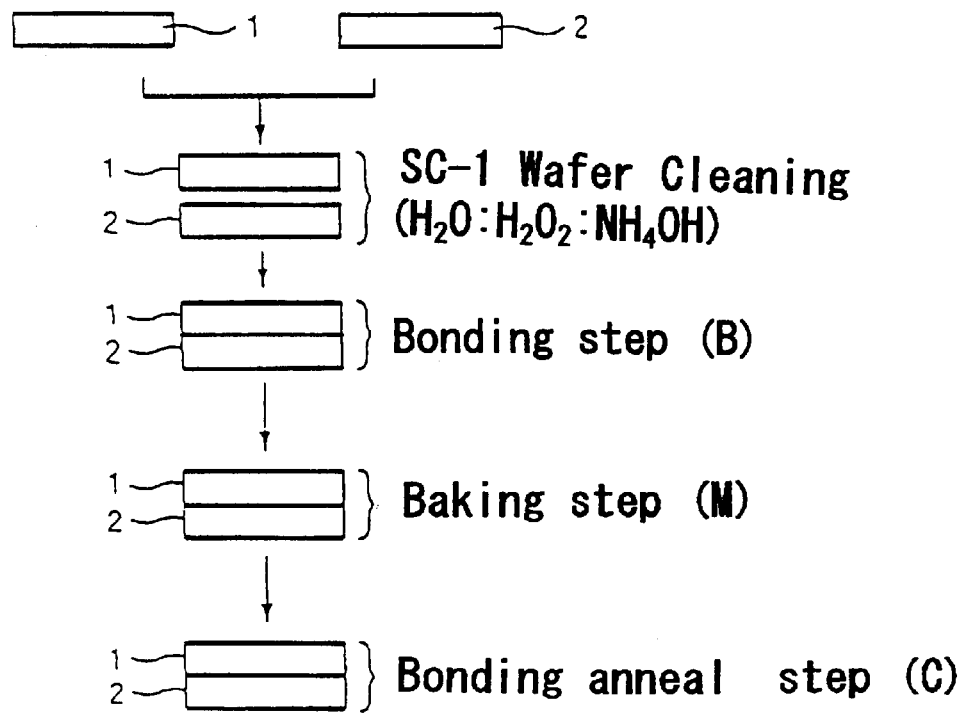
FIG. 7 illustrates the process flow of the wafer bonding method according to a second preferred embodiment of the present invention.
Figure 8:
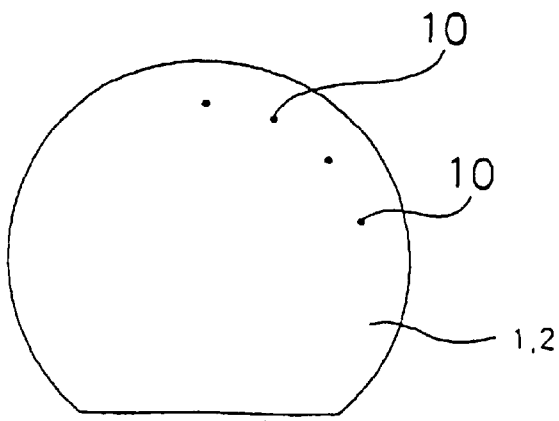
FIG. 8 is a schematic diagram illustrating the formation of voids.

The baking step is carried out at a temperature of 160° C. for 5, 10, 20 and 30 minutes, respectively. The numbers of voids are ascertained and are illustrated in FIG. 6. In all cases, including baking for 5 minutes (denoted by dot sign "●"), for 10 minutes (denoted by a sign "○"), for 20 minutes (denoted by the triangular sign "Δ") and for 30 minutes (denoted by the rectangular sign "□"), no void is observed even 600 minutes after the bonding step.

In the present embodiment, voids will be formed at about 140 minutes after the bonding step if the baking step is carried out after the bonding step at a temperature of about 80° C. for about 30 minutes. Moreover, voids are observed about 400 minutes after the bonding step if the baking step is carried out at a temperature of 100° C. for about 5 minutes. Therefore, the baking step can delay the void forming time, which is approximately 60 minutes after the bonding step without baking. Accordingly, the manufacturing method of the second embodiment involves first cleaning two polished semiconductor wafers 1 and 2. Then, the two wafers are fitted together by jigs. Next, a baking step, by which the present invention is characterized, is carried out. And finally, a bonding anneal step is carried out. The method is characterized in that the baking step at a temperature of about 80° C. for at least 30 minutes or about 100° C. for at least 5 minutes is carried out. It is preferable to perform a baking step at a temperature of between 100° C. and 200° C. for at least 10 minutes between the bonding step and the bonding anneal step. It is more preferable to perform a baking step at a temperature of between 100° C. and 200° C. for at least 30 minutes between the bonding step and the bonding anneal step.

Embodiment 3

Figure 9:
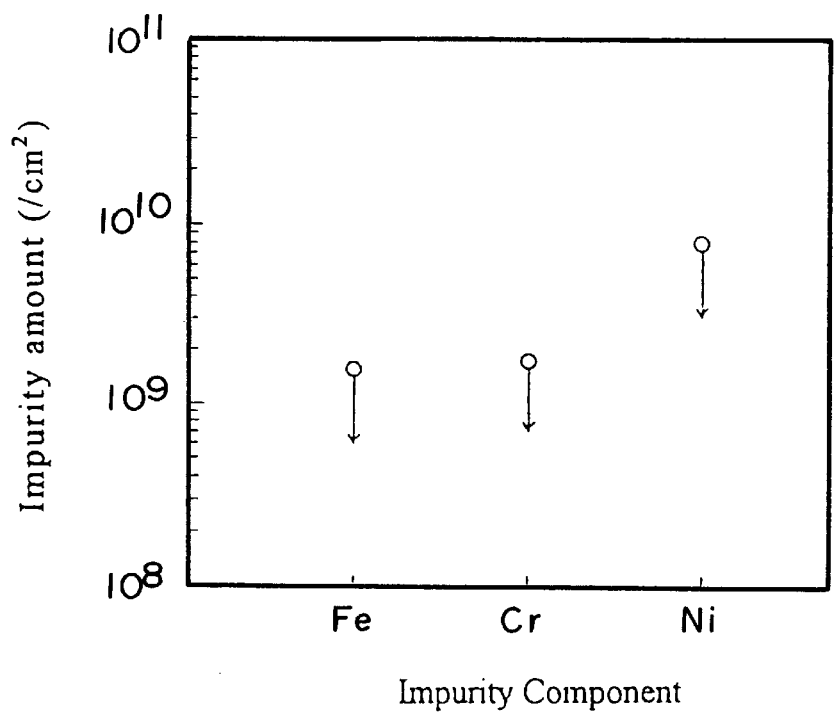
FIG. 9 shows the amount of the impurities attached on the surface of the wafers after cleaning with HF in a third preferred embodiment of the present invention.

As in the first embodiment, the third embodiment uses SC-1 ($H_2O:H_2O_2:NH_4OH$) to wash the base wafer and the active wafer which are mirror-polished, and then utilizes a bonding jig to bond the wafers. After baking the bonded wafer for 10 minutes at 100 to 200° C., the heavy metal impurities attached to the wafer are removed by cleaning with acidic solution, washing with water, and drying. FIG. 9 shows the effect of removing the impurities attached on the surface of the wafers after cleaning with HF. The wafer used that was obtained from a 6-inch semiconductor single crystal (p-type, crystallographic axis <100>, wherein the resistivity=10Ωcm) pulled in accordance with CZ method and which serves as a sample. The wafer is cleaned with HF having a concentration of 1.5% for 5 minutes, and is then washed with water and dried. Then, the amount of heavy metal impurities attached to the surface of the wafer is evaluated, which is determined by the WSA method (by means of an atomic absorption spectro-photometer). It was found that the amount of the impurities of Fe, Cr, Ni and so on is significantly decreased by these procedures. Hence, washing a wafer with an acidic solution along the lines of the present invention certainly reduces the impurities attached theron.

A mounted semiconductor wafer, which is baked after bonding, is cleaned by using HF solution, and then washed with water and dried. Thereafter, the bonded wafer is annealed. As the above embodiment which uses HF solution to clean the wafer, this embodiment also uses a wafer that is obtained from a 6-inch semiconductor single crystal (p-type, crystallographic axis <100>, wherein the resistivity=10 Ωcm) pulled in accordance with CZ method that serves as a sample. The embodiment of the fabrication method includes the steps of:

(1) using SC-1 to clean the base wafer and the active wafer, and then using a bonding jig to bond the wafers at room temperature;

(2) baking the bonded wafer for 15 minutes at 100° C.;

(3) using HF solution having a concentration of 1.5% to clean one set of wafers, then washing the set of wafers with water, and drying (for a comparison, another set of wafers was subjected to these same steps, but where step (3) of using HF to clean the set of wafers was omitted);

(4) annealing the above two sets of wafers for 2 hours at 1100° C.;

(5) using SPV method (surface photovoltage method) to determine the Fe-B concentration in the active wafer for the two sets of wafers.

Figure 10:
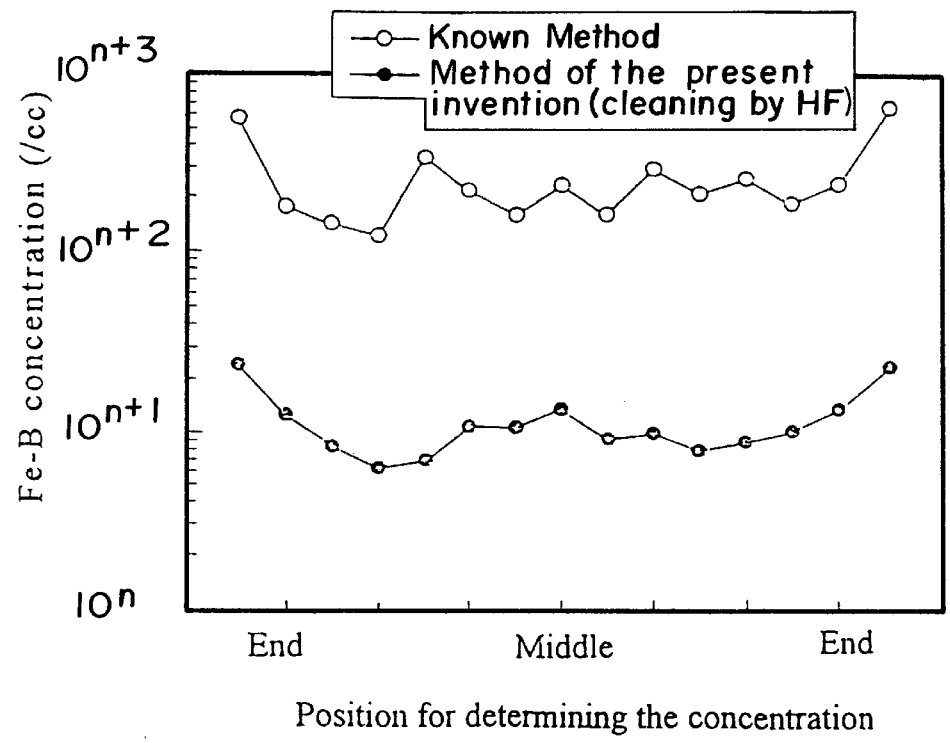
FIG. 10 is a diagram illustrating the relation of the concentration of Fe-B and the measured position of the wafer with or without being cleaned by using HF before annealing in the third preferred embodiment of the present invention.

FIG. 10 shows the effect on the concentration of Fe-B determined by whether HF solution is used to clean the wafer. The data in FIG. 10 demonstrates that by introducing a cleaning step the Fe concentration, which has a significant influence on the electrical characteristic of semiconductor devices, is reduced by an order of one, compared with the case having no cleaning step (3). Therefore, by further performing a cleaning step using acidic solutions as required in the present invention, an SOI substrate having an excellent electrical characteristics, especially having a high quality of long lifetime for carriers, can be obtained.

Figure 11:
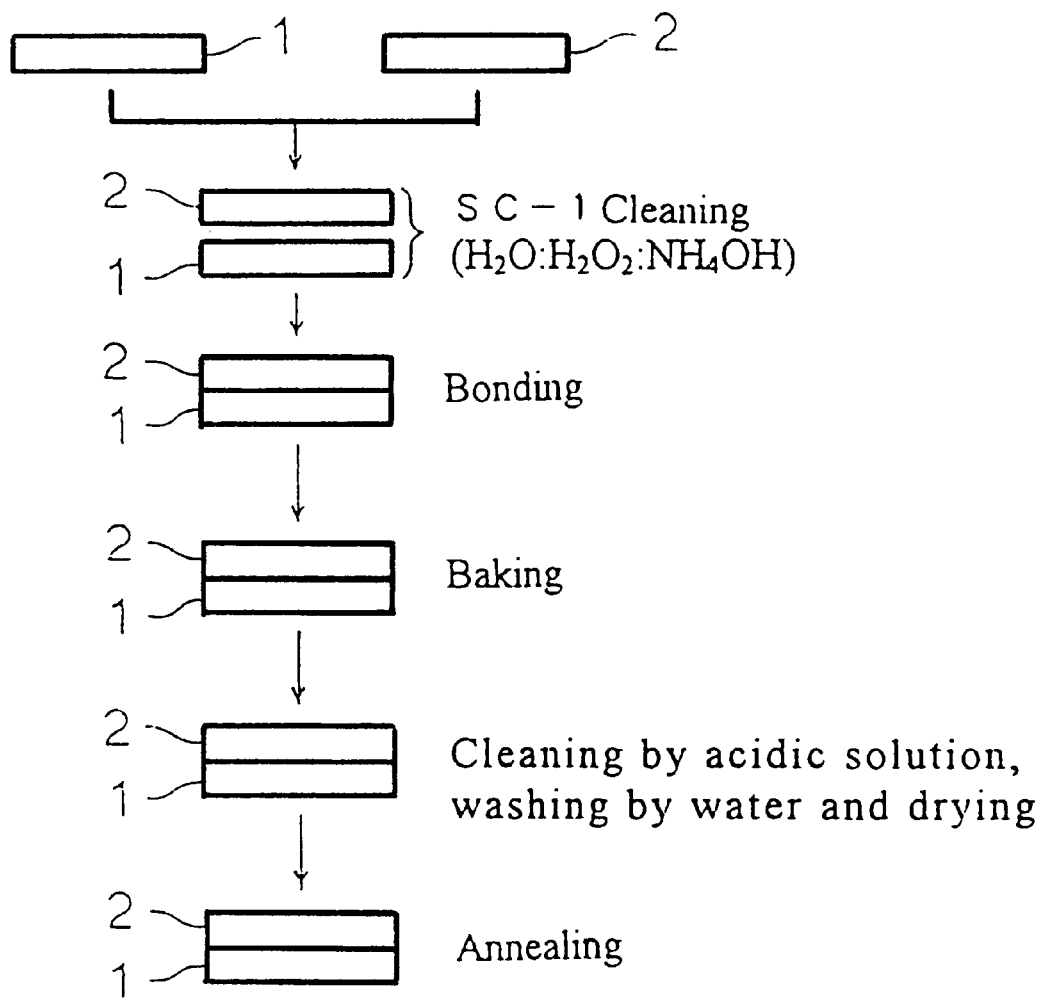
FIG. 11 is a diagram illustrating the fabrication process of the mounted semiconductor wafer according to the third preferred embodiment of the present invention.

Accordingly, as shown in FIG. 11, the third fabrication method of the present invention includes the steps of: using SC-1 to clean the two mirror-polished semiconductor wafers 1, 2, and using a bonding jig to bond the wafers; baking the bonded wafer; using acidic solutions (i.e. HF) to clean the bonded wafer; and then annealing the bonded wafer. The baking step is provided to prevent the number of voids from forming or increasing in number as time elapses after bonding of the base wafer and the active wafer. Further, a bonded wafer can be obtained with a certain bonding strength by performing the steps of cleaning with acidic solutions, washing with water and drying. Baking of the bonded wafer can place for over 5 minutes at above 100° C., preferably for over 10 minutes at 100 to 200° C. or as otherwise described in this application, in order to eliminate or reduce the formation of voids and thus achieve the benefits of the present invention.

According to the present invention described above, by annealing the bonded wafer within 1 hour after bonding or by baking the bonded wafer after bonding, it is possible to avoid the formation of any voids on the circumferential area of the bonded wafer and to thereby reduce the failure rate. The time between the bonding step and the annealing step can be remarkably lengthened where no voids are formed by baking the bonded wafer for a predetermined time at a predetermined temperature. This facilitates managing the fabrication process. Moreover, a high quality wafer can be obtained, since it can prevent heavy metal impurities attached to the surface of the wafer from diffusing into the wafer by baking the wafer after bonding and cleaning the surface of the wafer with acidic solutions.

As mentioned above, the present invention prevents the formation of voids on the edge regions of the wafers by carrying out the bonding anneal step or baking step as soon as possible after the bonding step, such as within an hour following the bonding step. Therefore, the number of defective products can be reduced. Moreover, the baking step, which is carried out at a predetermined temperature for predetermined time interval, can prevent the formation of voids between the bonding step and the bonding anneal step for an extended period of time, thereby enabling the increase or extension of the time interval between the bonding step and the bonding anneal step. Still further, a high quality wafer can be obtained, since the attachment of heavy metal impurities to the surface of the wafer can be prevented by baking the wafer after bonding, and then cleaning the surface of the wafer with acidic solutions. This eliminates the later diffusing of these heavy metal impurities into the water; such as by subsequent annealing thereof.

What is claimed is:

1. A method of fabricating direct-bonded semiconductor wafers, including the steps of:

bonding together two polished semiconductor wafers by bonding jigs; and performing bonding anneal to the two polished semiconductor wafers thus bonded to create tightly bonded interface between the wafers succeeding to the bonding step;

wherein said method is characterized in that the timing of the bonding step is controlled so as to be carried out within an hour prior to the bonding anneal step.

2. A method of fabricating direct-bonded semiconductor wafers, including the steps of:

bonding together two polished semiconductor wafers by bonding jigs; and performing bonding anneal to the two polished semiconductor wafers thus bonded to create a tightly bonded interface between the wafers succeeding to the bonding step;

wherein the semiconductor wafers are baked for 5 minutes over 100° C., and then are cleaned by using an acidic solution prior to the bonding anneal step.

3. The method of fabricating direct-bonded semiconductor wafers according to claim 2, wherein the performing bond annealing is carried out within one hour of the bonding.

* * * * *